United States Patent [19]
Feindt

[11] 3,987,371
[45] Oct. 19, 1976

[54] CIRCUIT ARRANGEMENT INCLUDING A SYNCHRONIZED OSCILLATOR THAT IS STABLE WITH RESPECT TO TEMPERATURE AND VOLTAGE VARIATIONS

[75] Inventor: Hans-Heinrich Feindt, Pinneberg, Germany

[73] Assignee: U.S. Philips Corporation, New York, N.Y.

[22] Filed: June 11, 1975

[21] Appl. No.: 585,873

[30] Foreign Application Priority Data
June 18, 1974 Germany............................ 2429183

[52] U.S. Cl.................................. 331/17; 331/20; 331/25; 331/34; 331/111
[51] Int. Cl.² ........................................... H03B 3/04

[58] Field of Search .................... 331/17, 18, 25, 34, 331/8, 20

[56] References Cited
UNITED STATES PATENTS
| | | | |
|---|---|---|---|
| 3,659,224 | 4/1972 | Ball.................................... | 331/8 X |
| 3,857,110 | 12/1974 | Grebene............................ | 331/8 X |

Primary Examiner—Siegfried H. Grimm
Attorney, Agent, or Firm—Frank R. Trifari; Henry I. Steckler

[57] ABSTRACT

A TV circuit for generating a synchronized horizontal frequency signal has an oscillator and a phase discriminator. The discriminator has a current applied to it that is derived from and proportional to a current in the oscillator so as to eliminate the effects of temperature and voltage variations.

4 Claims, 4 Drawing Figures

CIRCUIT ARRANGEMENT INCLUDING A SYNCHRONIZED OSCILLATOR THAT IS STABLE WITH RESPECT TO TEMPERATURE AND VOLTAGE VARIATIONS

The invention relates to a circuit arrangement for generating a synchronized periodic voltage, which circuit arrangement includes an oscillator the frequency of which depends substantially linearly on a first direct-current value and a phase discriminator the output control quantity of which in the case of constant frequency and phase is substantially linearly dependent on a second direct-current value.

In a known circuit of this type (see for example "Mullard Technical Communications" No. 118, April 1973, pages 249 to 257) the two direct-current values, which each may be present as a direct current or as a direct voltage, are separately generated by known means, such as voltage dividers and current generators. Hence they are largely independent of one another and can be separately adjusted. However, the invention is based on the recognition that as a result various dependences, in particular with respect to variations of the ambient temperature or the supply direct voltage, may occur, so that the static overall control sensitivity is not constant to the desired degree, for the relative tuning sensitivity $S_o$ of the oscillator is:

$$S_o = \frac{df/f_o}{dG} \qquad (1)$$

where $f_o$ is the nominal frequency, $df$ is the frequency deviation and $dG$ is the variation of the direct-current value, either a voltage or a current, associated with a given variation of the oscillator frequency.

The static control sensitivity $S_p$ of the phase discriminator is $$S_p = \frac{dG}{dT/T_o} \qquad (2)$$

where $T_o$ is the period of the nominal frequency $f_o$ and $dT$ is the time deviation within a period which is caused by a variation $dG$ of the direct-current value, either voltage or current, used as the control quantity.

The static overall control sensitivity $S$ is obtained by multiplying the said sensitivities by one another:

$$S = S_o \cdot S_p = \frac{df/f_o}{dT/T_o} \qquad (3)$$

and consequently it is equal to the ratio between the relative frequency variation and the relative time deviation.

If $S$ is to be independent of variations of the ambient temperature and/or of the operating voltage or of other quantities, the relative variations which appear in the numerator and in the denominator of formula (3) must have the same dependence on the relevant quantity, so that these dependences cancel one another in respect of their influence on the control sensitivity $S$. For this purpose a circuit arrangement according to the invention is characterized in that the second direct-current value is derived from the first direct-current value and is proportional thereto.

Owing to the proportional direct-current dependence of the oscillator detuning and to the proportional direct-current dependence of the control quantity of the discriminator the numerator and the denominator on the right-hand side of formula (3) are equally dependent on the current supplied so that this dependence can be eliminated in the overall control sensitivity $S$ if the two currents are maintained proportional to one another.

The invention can be used to particular advantage if the oscillator and the phase discriminator form parts of the same integrated circuit, for in this case the current supply of the discriminator within the said circuit can be derived from the current supplied to the oscillator so that no external connections are required and the external connection which would otherwise be used now can be employed for other purposes.

Embodiments of the invention will now be described, by way of example, with reference to the accompanying diagrammatic drawings, in which.

Figure 1:
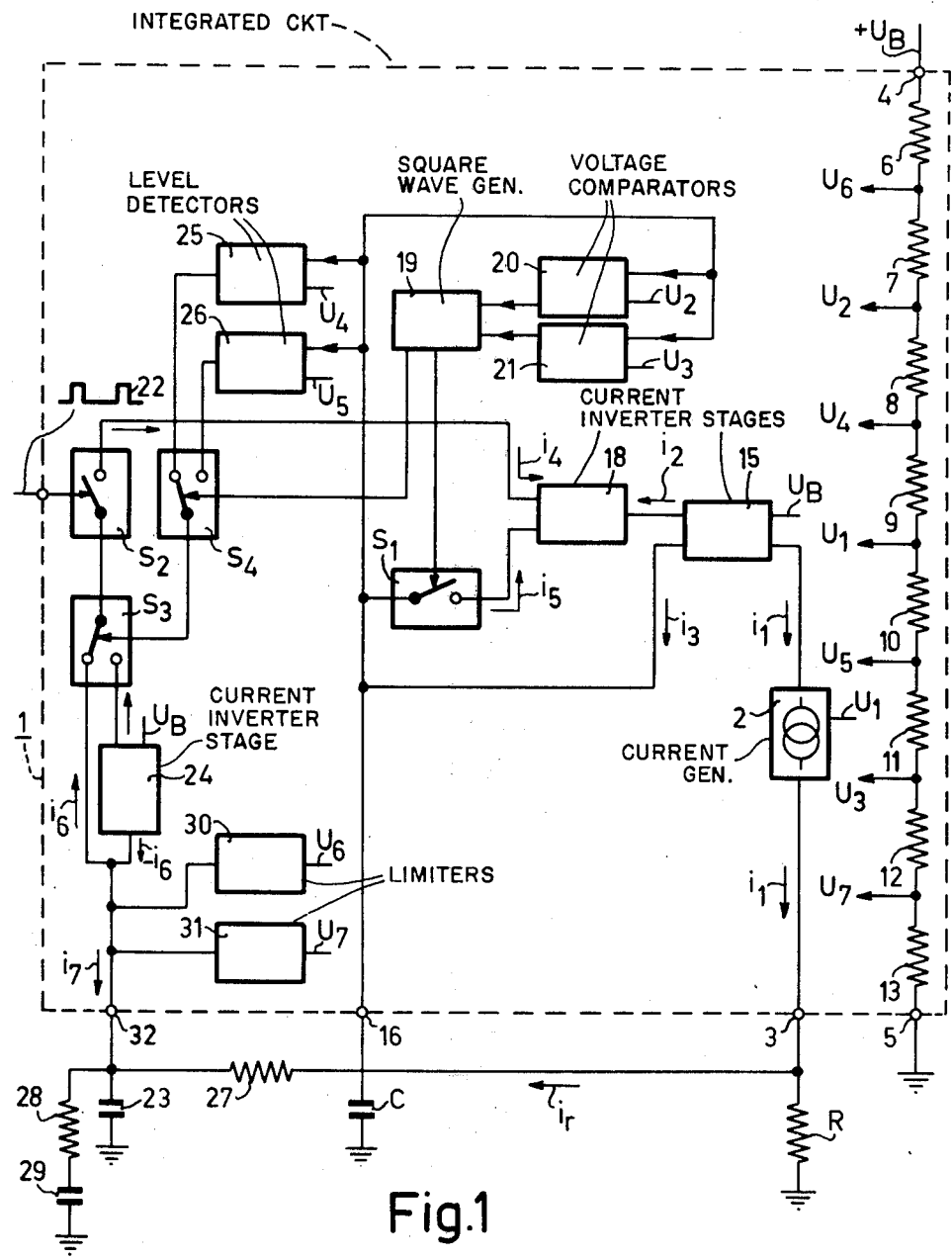
FIG. 1 is a block schematic diagram of a circuit according to the invention.

Referring now to FIG. 1, a broken-line box 1 indicates that the enclosed circuit components are arranged in known manner in an integrated circuit. A current generator 2 generates a current $i_1$ of, for example, 0.5 mA which is supplied via a terminal 3 to a resistor R which is located externally of the circuit 1 and is connected to earth. Its value is chosen so that the voltage drop across it is substantially proportional, and preferably exactly equal, to a reference voltage $U_1$ applied to current generator 2. This voltage may be derived from one of the tappings, indicated by arrows, on a voltage divider which is provided in the integrated circuit and is connected between terminals 4 and 5 which are connected to the positive terminal $+U_b$ and the negative terminal respectively of a supply voltage source, which negative terminal is also connected to earth. The said voltage divider comprises resistors 6 to 13 which have suitable values. In principle the various voltage values may alternatively be derived from separate voltage dividers which each consist of a smaller number of resistors, for example two resistors, connected between $+U_b$ and earth. However, the relative proportionality of the derived voltages is more exact when they are taken from a single voltage divider.

Current $i_1$ also flows to a current inverter stage 15 (for example a current mirror circuit) which supplies two currents $i_2$ and $i_3$ which, viewed from the generator 2, flow in a direction opposite to that of $i_1$. Current $i_3$ is about 0.47 mA and current $i_5$ is about 0.94 mA. Current $i_3$ is supplied as a charging current via a terminal 16 to a capacitor C so that across this capacitor a voltage is set up which is positive with respect to earth. Currents $i_1$, $i_2$ and $i_3$ are supplied by a positive source, in FIG. 1 supply source $+U_b$.

Current $i_2$ is supplied to a second current inverter stage 18 which absorbs currents $i_4$ and $i_5$ and hence delivers currents $-i_4$ and $-i_5$. Current $-i_5$ is supplied to a controlled switch $S_1$ which is opened and closed in the rhythm of a control quantity supplied by a square-wave generator 19. The absolute value of current $i_5$ is greater than, for example twice, that of current $i_3$. When the switch $S_1$ conducts, the discharge current $i_5$ predominates so that the voltage U across the capacitor C decreases linearly with time. When switch $S_1$ is cut off, capacitor C is charged linearly with time by current $i_3$. When current $i_5$ is twice current $i_3$ the slope of voltage U is the same during charging and discharging. In an embodiment used in a television receiver the period of the obtained sawtooth voltage is equal to a line period, i.e. 64 μs.

Figure 2:
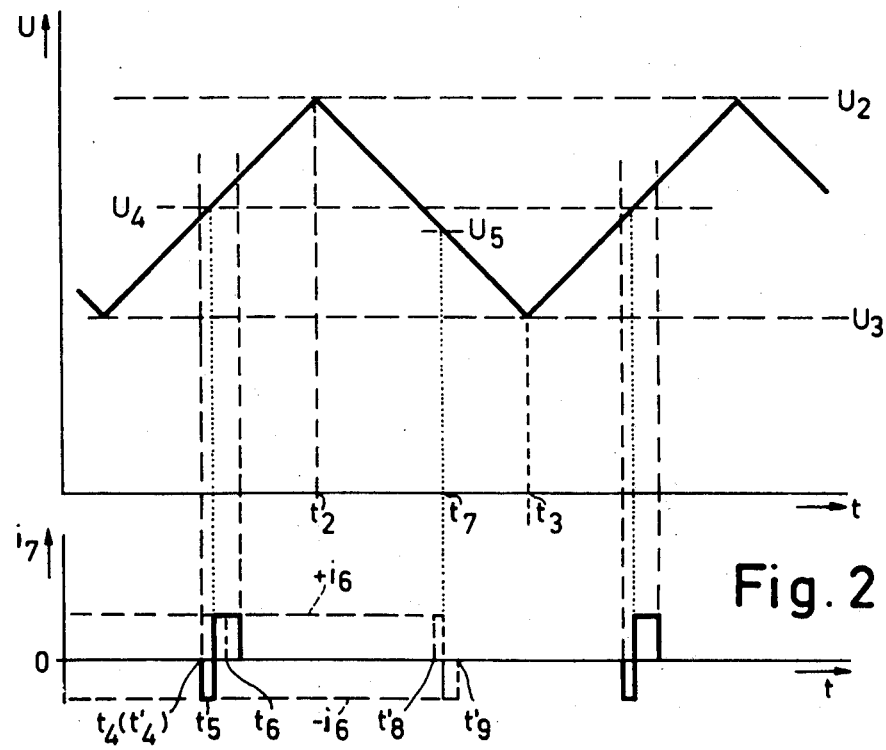
FIG. 2 is the waveform of the voltage U across a capacitor which forms part of the oscillator.

Voltage U is also supplied to two voltage comparison stages 20 and 21 in which it is compared with a voltage $U_2$ of about 7.6 volts and a voltage $U_3$ of about 4.4 volts, respectively which each are derived from a tapping on the voltage divider 6 to 13. When at an instant $t_2$ voltage U reaches its maximum value, which is determined by voltage $U_2$ in the stage 20 acting as a level detector and may be equal to this voltage, and when at an instant $t_3$ voltage U reaches its minimum value, which corresponds to the voltage $U_3$ in level detector 21, a control quantity is supplied to the generator 19. As a result switch $S_1$ is operated and capacitor C is switched to charging or discharging by currents $i_3 - i_5$ and $i_3$ respectively. The resulting sawtooth voltage U is shown in FIG. 2 and the duration of the ascending edge is equal to that of the descending edge.

Figure 3:
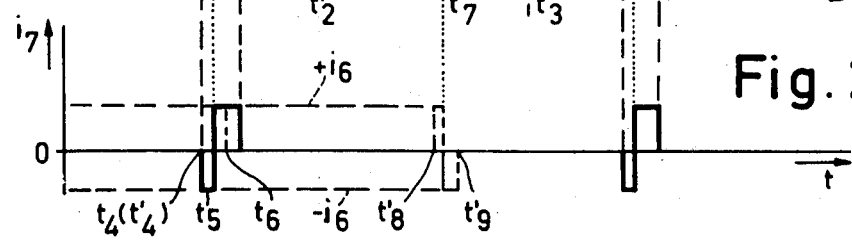
FIG. 3 is the waveform of the current $i_7$ at the output of the phase discriminator.

A current $-i_4$ of about 2.1 mA supplied by current inverter stage 18 is supplied to a phase discriminator. This includes a switch $S_2$ which is controlled by synchronizing pulses 22, for example the line pulses separated from a television signal. The switch allows current $-i_4$ to flow to the change-over switch $S_3$ only during the occurrence of the pulses 22 between instants $t_4$ and $t_6$. In the position shown of switch $S_3$, with switch $S_2$ conducting, a current $-i_6$ is allowed to pass and supplied as $i_7$ via a terminal 32 to a capacitor 23 of about 10 nF so that this capacitor is discharged. Current $-i_6$ may be equal to current $-i_4$, but it may have a different value. When at an instant $t_5$ switch $S_3$ passes to the other condition, current $i_4$ is supplied to a current inverter stage 24 and then with the same value but opposite sign (about + 2.1 mA) to capacitor 23 so that this capacitor is charged. Desirably, but not necessarily, the output current $i_6$ of stage 24 is equal in absolute value to the current $-i_4$ supplied to it. FIG. 3 shows that capacitor 23 has a current $i_7$ supplied to it, the amplitude of which alternates between the values $-i_6$ and $+i_6$.

Switch $S_3$ is controlled at instant $t_5$ by a switch $S_4$ which in the condition shown transmits a changeover criterion for switch $S_3$ when voltage U reaches a value of + 6.6 volts. A level detector 25 to which a reference voltage $U_4$ of about 6.6 volts is applied delivers a signal at the relevant limit value.

When between instants $t_4$ and $t_6$ switch $S_2$ is rendered conductive by a synchronizing pulse 22, first a negative current $-i_6$ flows to capacitor 23 (see FIG. 3). At instant $t_5$ voltage U reaches the limit value $U_4$ so that switch $S_3$ is changed over and hence a positive current $+i_6$ flows to capacitor 23. The current $i_7$ to capacitor 23 then has the form of a double pulse of alternating sign, which pulse will in general be asymmetric. Its mean value is a direct current which is supplied to the capacitor 23 and may change the voltage across it. From this voltage a control current $i_r$ is derived via a resistor 27 of about 82 kΩ, which current flows to the terminal 3.

Owing to the aforedescribed operation of current generator 2, which maintains the voltage across resistor R constant, the current $i_1$ is increased, or with positive direction of current $i_r$ reduced, by a corresponding amount so that the charging current of capacitor C varies correspondingly and the slope of the rise of voltage U is corrected. Because the limit values $U_2$ and $U_3$ are fixed, this means that the instants at which the voltage U switches over will approach one another or move further apart respectively, so that the frequency is correspondingly increased or reduced respectively. This process continues until the frequencies of the pulses 22 and the voltage U are equal, with a residual time deviation $\Delta T$ with respect to the desired value, for which deviation the obtained control current effects the required frequency variation $\Delta f$ with respect to the frequency $f_o$ with current $i_1$ constant.

In principle switch $S_3$ may be switched back by means of level detector 25 only during the descending edge between instants $t_2$ and $t_3$ at an instant which, however, is in a fixed unvariable relation to instant $t_5$ during the ascending edge. By contrast the switching instant $t_7$ can be freely chosen, for example for determining the phase relation relative to the triangular voltage, if, as shown in FIG. 1, a second level detector 26 is provided having a voltage $U_5$ of about 5.4 volts derived from the voltage divider 6 to 13, which detector is rendered operative by means of the change-over switch $S_4$ which at instant $t_2$ is controlled by, for example, square-wave generator 19. As a result, the switching back of switch $S_3$ is determined by voltage $U_5$. Level detector 25 switches back when voltage U passes through the value $U_4$ in the downward direction. Because switch $S_4$ then is in the changed-over condition, this does not affect switch $S_3$.

At instant $T_3$ the two level detectors 25 and 26 are in the switched-back condition and the square-wave generator 19 returns the switch $S_4$ to the condition shown. Hence, at the next ascending edge the detector 25 is operative again when voltage $U_4$ is passed through at the instant $t_5$ of the next interval.

During field retrace the synchronizing pulses of a television signal include pulses at twice the line frequency but with one half of the duration. These fall in the range of the descending edge of voltage U as shown in FIG. 2 so that a current flows to the phase discriminator between instants $t'_8$ and $t'_9$ also. However, instant $t_7$ can be suitably selected by the choice of voltage $U_5$ of level detector 26. The said instant may, for example, be selected so as to fall outside the pulses at twice the line frequency so that these are not operative. However, the control voltage still is affected, for during the field retrace interval the synchronizing pulses 22 are shorter. It is true that they commence at an instant $t'_4$ which is later than the leading edges $t_4$ of the line pulses by an integral number of line periods, but the instants $t'_6$ of the trailing edge thereof is shifted relative to the corresponding instant $t_6$ of the normal line pulses. Because the change-over instants $t_5$ and $t_7$ do not change, the amounts of charge which are supplied to capacitor 23 by the currents $-i_6$ and $+i_6$ respectively before and after the said change-over instants do change and the sign of the mean value of current $i_7$ may even be reversed.

If now the voltage $U_5$ is selected so that the interval between the change-over instants $t_5$ and $t_7$ is exactly equal to one half of the period of voltage U, during the short pulses in the time from $t'_8$ to $t'_9$ a contribution to the control voltage is provided which is exactly equal to, but has a sign opposite to that of, the contribution in the time from $t'_4$ to $t'_6$. Consequently during field retrace no variation of the control voltage across capacitor 23 is produced.

Controllability may be further influenced in known manner by RC networks included in the control circuit, for example, by the series combination of a resistor 28 of about 1.2 kΩ and a capacitor 29 of about 47 μF in parallel with control capacitor 23.

In order to avoid overdriving, in particular in the unsynchronized condition and during pull-in, limiter stages 30 and 31 are provided which are connected to tappings on the voltage divider 6 to 13 at which reference voltages $U_6$ of about 8.2 volts and $U_7$ of about 3.8 volts respectively appear, so that the voltage across capacitor 23 lies within the limit values determined by voltages $U_6$ and $U_7$.

According to the invention the current $-i_4$ supplied to switch $S_2$ via the current inverter stages 18 and 15 is proportional to the charging current $i_5 - i_3$ and the discharge current $-i_3$ respectively of capacitor C. This ensures that in the case of variations of current generator 2 both the charging and discharging of capacitor C and the current pulses $i_7$ for capacitor 23 vary in the same way, so that the aforementioned control sensitivity S is retained. This may be utilized in particular in the case that the frequency generated must be changed over, which may be effected, for example, by changing capacitor C or resistor R. The control sensitivity S will then be retained at the new frequency also.

Figure 4:
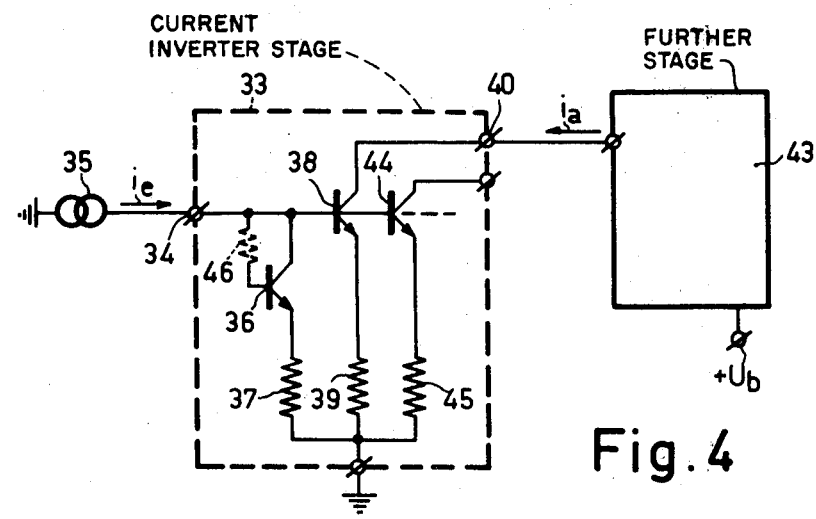
FIG. 4 is a circuit diagram of a temperature-stabilized circuit for producing various currents which are proportional to one another.

FIG. 4 shows the circuit diagram of a current inverter stage the fundamental construction of which can be used in the invention, for example for stages 15, 18 and 24. The said current inverter stage is in the form of an integrated circuit, which is indicated by the broken-line box 33. A current source 35 supplies to an input terminal 34 an input current $i_e$ which, in accordance with the indication by means of arrows used for transistors, indicates a positive current from outside to stage 33. This current flows to the base and the collector of an npn transistor 36 which is connected as a diode and the emitter of which is connected to earth via a resistor 37. Across elements 36 and 37 a voltage drop is produced which controls the base of a transistor 38 the emitter of which is connected via a resistor 39 to earth and consequently to the other terminal of current source 35. Owing to the current amplification properties of transistor 38 the application of a positive voltage produces in its collector lead at an output terminal 40 an output current $i_a$ proportional to input current $i_e$. Current $i_a$ can control a further stage 43 which is connected to the positive terminal of a supply source $U_b$. Whereas input current $i_e$ of stage 33 is directed inwards, the output current $i_a$ supplied by this stage flows outwards into the further stage 43. Thus this current is reversed in direction or mirrored.

Stage 33 may supply further reversed input currents because the base of transistor 38 is connected to the base of at least one further transistor 44 an emitter resistor 45 of which is connected to earth and which at its collector also supplies a reversed output current which is proportional to the input current $i_e$.

If the stage shown in FIG. 4 is required to absorb or supply currents of different directions, it must be constructed with pnp transistors whilst resistors 37, 39 and 45 are connected with respect to a positive voltage source, for example, supply voltage $+U_b$.

The choice of the emitter resistors, for example 39 and 45, enables the values of the output currents and hence their proportionality factors relative to the input current $i_e$ to be chosen at will. They may be equal to or different from one another. Similar differences are possible also when the geometry of the transistors, i.e. the surface areas of their electrodes on the semiconductor chip, are different. Preferably for different output currents the geometry is selected so that the densities of the emitter currents are equal, so that the emitter base voltages of the various transistors also are equal. Thus they have substantially equal properties, for example the same temperature dependence. By means of a base resistor 46 of transistor 36 the influence of the various current gain factors of the transistors can be compensated.

What is claimed is:

1. Circuit arrangement for generating a synchronized periodic voltage, said circuit arrangement comprising an oscillator the frequency of which depends substantially linearly on a first direct-current value, a phase discriminator coupled to said oscillator and the output control quantity of which in the case of constant frequency and phase is substantially linearly dependent on a second direct-current value, and means for providing that the second direct-current value is derived from the first direct-current value and is proportional thereto.

2. Circuit arrangement as claimed in claim 1, wherein the oscillator includes a capacitor, and means for charging said capacitor within a period from a first threshold value voltage to a second threshold value voltage by a charging current and for discharging said capacitor to the first threshold value voltage by a discharging current proportional to the charging current, the second direct-current value being proportional to the charging current and having substantially the same dependence on at least one of the ambient temperature and the supply voltage.

3. Circuit as claimed in claim 2 wherein the phase discriminator includes a switch means for allowing during the occurrence of a pulsatory synchronizing signal a current to flow to an output terminal which delivers the control quantity and at a given instant has its direction reversed with respect to the oscillator voltage, the discriminating current being proportional to the charging current and having substantially the same dependence on at least one of the ambient temperature and the supply voltage.

4. Circuit as claimed in claim 2, wherein said providing means comprises at least one current inverter stage.

* * * * *